(12) United States Patent
Eggleston et al.

(10) Patent No.: US 10,038,301 B1
(45) Date of Patent: Jul. 31, 2018

(54) HYBRID MODE-LOCKED LASER WITH TUNABLE NUMBER OF COMB LINES

(71) Applicants: Michael S. Eggleston, New York, NY (US); Guilhem de Valicourt, Jersey City, NJ (US)

(72) Inventors: Michael S. Eggleston, New York, NY (US); Guilhem de Valicourt, Jersey City, NJ (US)

(73) Assignee: Nokia of America Corporation, Murray Hill, NJ (US)

( * ) Notice: Subject to any disclaimer, the term of this patent is extended or adjusted under 35 U.S.C. 154(b) by 0 days.

(21) Appl. No.: 15/464,459

(22) Filed: Mar. 21, 2017

(51) Int. Cl.
H01S 5/00 (2006.01)
H01S 5/065 (2006.01)
H01S 5/30 (2006.01)
H01S 5/10 (2006.01)
H01S 5/50 (2006.01)
H01S 5/02 (2006.01)

(52) U.S. Cl.
CPC .......... H01S 5/0653 (2013.01); H01S 5/0078 (2013.01); H01S 5/0657 (2013.01); H01S 5/101 (2013.01); H01S 5/1028 (2013.01); H01S 5/1092 (2013.01); H01S 5/3013 (2013.01); *H01S 5/021* (2013.01); *H01S 5/50* (2013.01)

(58) Field of Classification Search
CPC ...... H01S 5/0653; H01S 5/0657; H01S 5/101; H01S 5/1068; H01S 5/3013; H01S 5/1092; H01S 5/0078; H01S 5/50; H01S 5/121
See application file for complete search history.

(56) References Cited

U.S. PATENT DOCUMENTS 7,286,765 B2 10/2007 Noirie
7,733,923 B2 6/2010 Doerr
(Continued)

FOREIGN PATENT DOCUMENTS

EP 2437087 A1 4/2012
WO 2017131879 A1 8/2017
WO 2017131898 A1 8/2017

OTHER PUBLICATIONS

Po Dong et al. "Reconfigurable 100 Gb/s Silicon Photonic Network-on-Chip", vol. 7, No. 1/Jan. 2015/J. Opt. Commun. Netw. A37.
(Continued)

*Primary Examiner* — Kinam Park
(74) *Attorney, Agent, or Firm* — The Capitol Patent & Trademark Law Firm, PLLC (57) ABSTRACT

A hybrid laser structure (comprising III-V gain material and a silicon-based photonic integrated circuit) is configured to control the number of generated mode-locked wavelengths by including an optical wavelength filter within the photonic integrated circuit portion of the laser cavity. The optical wavelength filter is used to control the number of comb lines that are supported by the laser cavity, filtering out a set of non-selected mode-locked wavelengths to control the generated number. The optical filter may be passive or active, and the number of generated comb lines may be fixed or adjustable, as desired.

14 Claims, 5 Drawing Sheets

(56) References Cited

U.S. PATENT DOCUMENTS

| | | |
|---|---|---|
| 8,929,408 B1 | 1/2015 | Diels et al. |
| 9,054,493 B2 | 6/2015 | Krishnamoorthy et al. |
| 9,166,704 B1 * | 10/2015 | Nagarajan ............... H04B 10/70 |
| 9,190,797 B2 | 11/2015 | Schneider |
| 9,195,113 B2 | 11/2015 | Cox |
| 9,372,306 B1 * | 6/2016 | Nagarajan .......... G02B 6/12004 |
| 9,768,587 B1 * | 9/2017 | Zheng ................... H01S 5/1028 |
| 2010/0296812 A1 | 11/2010 | Asghari |
| 2012/0195332 A1 | 8/2012 | Yoffe et al. |
| 2013/0089333 A1 * | 4/2013 | Shen .................... H04B 10/506 398/79 |
| 2014/0133511 A1 | 5/2014 | Tanaka |
| 2015/0023382 A1 | 1/2015 | Schell et al. |
| 2015/0207291 A1 * | 7/2015 | Rickman ................. H01S 5/142 372/20 |
| 2015/0215043 A1 | 7/2015 | Debregeas |
| 2016/0156999 A1 * | 6/2016 | Liboiron-Ladouceur .................. H04Q 11/0005 398/51 |
| 2016/0164246 A1 | 6/2016 | Rickman et al. |
| 2016/0315451 A1 * | 10/2016 | de Valicourt ......... H01S 5/1007 |
| 2017/0026133 A1 | 1/2017 | Antona et al. |

OTHER PUBLICATIONS

K. Merghem et al.' "Pulse generation at 346 GHz using a passively mode locked quantum-dash-based laser at 1.55 m", APL, 94, 2009.

B. R. Koch, A. W. Fang, O. Cohen, and J. E. Bowers, "Mode-locked silicon evanescent lasers," Opt. Express, vol. 15, No. 18, pp. 11225-11233, 2007.

S. Srinivasan, A. Arrighi, M. J. R. Heck, J. Hutchinson, E. Norberg, G. Fish, and J. E. Bowers, "Harmonically Mode Locked Hybrid Silicon Laser With Intra-Cavity Filter to Suppress Supermode Noise," IEEE J. Sel. Top. Quantum Electron., vol. 20, No. 4, pp. 8-15, Jul. 2014.

J. Poette, P. Besnard, L. Bramerie and J.-C. Simon, "Highly sensitive measurement technique of relative intensity noise and laser characterization", Fluctuations and noise letters 8, L81-L86 (2008).

M. Gay et al., "Single Quantum Dash Mode-Locked Laser as a Comb-Generator in Four-Channel 112 Gbit/s WDM Transmission", OFC, Tu2h.5, 2014.

Po Dong , Young-Kai Chen, and Lawrence L. Buhl, "Reconfigurable Four-Channel Polarization Diversity Silicon Photonic WDM Receiver", in Proc OFC, W3A.2, 2015.

* cited by examiner

HYBRID MODE-LOCKED LASER WITH TUNABLE NUMBER OF COMB LINES

TECHNICAL FIELD

The present invention relates to optical components and in particular to a mode-locked laser.

BACKGROUND

Comb sources and multi-frequency lasers are key candidates for enabling the move to lower costs for optical communication systems. As is well-known in the art, a comb generator allows for a given laser device to emit at a number of spaced-apart, separate wavelengths ("comb lines"). Compared to a conventional transponder architecture that utilizes a separate tunable laser with each modulator, the introduction of a comb source allows for a single tunable laser source to be shared among several modulators, each modulator utilizing a separate one of the comb lines.

While the utilization of a comb source is beneficial, the number of simultaneously lasing wavelengths depends primarily on the gain bandwidth of the specific material used to create the comb and fixed cavity parameters associated with the laser. To date, mode-locked lasers (MLLs) have typically been able to control the mode spacing (i.e., separation between emission lines) and not the actual number of comb lines that are generated. As a result, it is typical that a substantially larger number of comb lines are generated than required for a specific application, sacrificing power efficiency and increasing noise present in the optical communication system.

SUMMARY

The needs remaining in the prior art are addressed by the present disclosure, which relates to a mode-locked laser and, more particularly, to a hybrid mode-locked laser based upon a combination of a III-V-based gain element and a silicon-based photonic integrated circuit (PIC). One cavity mirror is formed within the III-V element, with the opposing mirror formed within the PIC element (thus creating a "hybrid laser cavity" across the combination of elements). An optical wavelength filter component is disposed within the PIC element and positioned along the signal path of the hybrid laser cavity. By controlling the characteristics of the wavelength filter (i.e., wavelengths passed or rejected), the number of mode-locked wavelengths (also referred to at times hereinafter as "comb lines") generated by the hybrid laser structure is also controlled.

In accordance with one exemplary embodiment of the present invention, the optical waveguide filter is formed as a passive device, providing a fixed output of comb lines as a function of the filter passband. Alternatively, the optical waveguide filter may be formed as an active device having a tunable passband (tunable in both bandwidth and center wavelength), allowing for the number of generated comb lines to be tuned. In an exemplary embodiment, the tuning may be dynamic and controllable by the user to modify the number of generated comb lines as a function of time.

The optical filter may incorporate ring resonators, gratings, or any other suitable type of silicon-based optical wavelength filtering component.

One exemplary embodiment of the present invention takes the form of an apparatus comprising a gain element formed of III-V material and including a first mirror, and a silicon photonic integrated circuit (PIC) coupled to the gain element. The silicon PIC includes an optical waveguide coupled at a first end to the gain element, a second mirror coupled to a second end of the optical waveguide (opposing the first end of the optical waveguide). The first mirror is formed to exhibit a first reflectivity, and the second mirror is formed to exhibit a second reflectivity which is different from the first reflectivity. The first mirror and the second mirror thus define a hybrid laser cavity configured to generate a number of mode-locked output wavelengths. The silicon PIC further includes a silicon-based optical filter disposed along the hybrid laser cavity and configured to control the number of mode-locked wavelengths generated as an output of the apparatus.

Another exemplary embodiment of the present invention defines a method comprising the following: providing III-V gain material having a termination including a mirror facet, providing a silicon-based photonic integrated circuit (PIC) including an optical waveguide (terminating at a mirror element) and an optical filter disposed along the optical waveguide (the optical filter having a tunable passband), coupling the gain material to the photonic circuit so as to create a hybrid laser cavity between the mirror facet of the gain material and the mirror element of the silicon-based PIC, defining a specific number of mode-locked wavelengths, and tuning the optical wavelength filter to pass the defined, specific number of mode-locked wavelengths.

Other and further embodiments of the present invention will become apparent during the course of the following discussion and by reference to the accompanying drawings.

BRIEF DESCRIPTION OF THE DRAWINGS

Referring now to the drawings, where like numerals represent like parts in several views:

FIG. 2(a) is a time response auto-correlation plot and FIG. 2(b) is an optical spectrum illustrating the complete set of mode-locked wavelengths associated with this cavity;

FIG. 3(a) is a time response auto-correlation plot and FIG. 3(b) is an optical spectrum illustrating the complete set of mode-locked wavelengths associated with this cavity;

FIG. 5(a) illustrates the generated comb lines (optical spectrum) without any optical filtering, FIG. 5(b) shows an exemplary optical filtering characteristic as used in combination with the generated comb lines of FIG. 5(a), and FIG. 5(c) is a plot of the selected comb lines provided as an output from the hybrid laser structure according to some embodiments;

DETAILED DESCRIPTION

By way of introduction, it is known that optical gain material, such as bulk, quantum well, or quantum dot III-V material can be formed into a Fabry-Perot (FP) laser on a III-V chip. Multiple modes are generated in such a cavity, and can be actively mode-locked or passively mode-locked by using a saturable absorber or applying four-wave mixing (FWM) to the generated signals.

Figure 1:
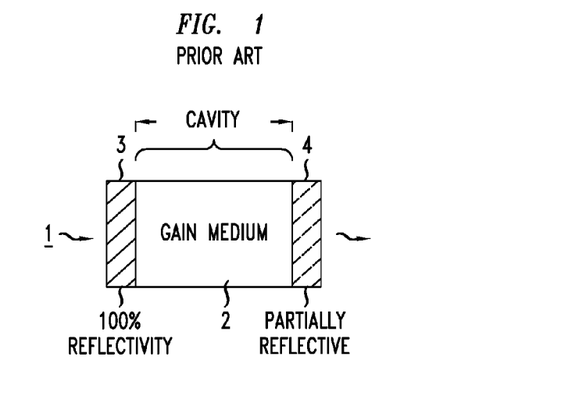
FIG. 1 is a simplified diagram of an example of a prior art Fabry-Perot (FP) mode-locked laser.

FIG. 1 is a simplified diagram of a prior art FP laser 1 that may be used to generate multiple modes, which when locked, create an optical source exhibiting a number of fixed, stable emission lines. Such a structure is typically referred to as "comb", with each stable mode-locked wavelength defined as a "comb line". FP laser 1 is shown as comprising a III-V gain element 2 disposed between a pair of mirrors 3 and 4. In this particular arrangement, mirror 3 is defined as a 100% reflective mirror and mirror 4 is defined as a partially reflective mirror. An optical signal propagating within gain element 2 passes back and forth between mirrors 3 and 4, and ultimately exits the structure via partially reflective mirror 4 ("partially reflective" for the purpose of creating a laser cavity being on the order of 10-30% reflective). The cavity length for FP laser 1 is defined as distance between mirrors 3 and 4.

Figure 2:
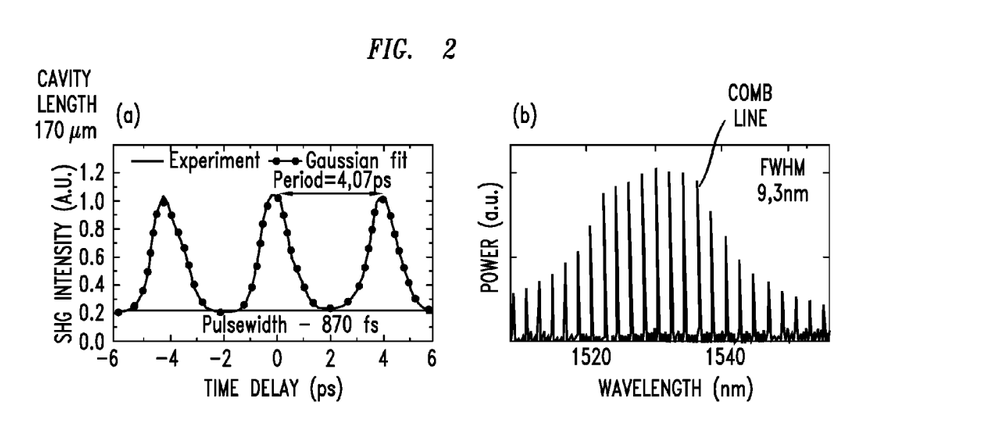
FIG. 2 contains plots for the FP laser of FIG. 1 for a cavity length of 170 µm, where
Figure 3:
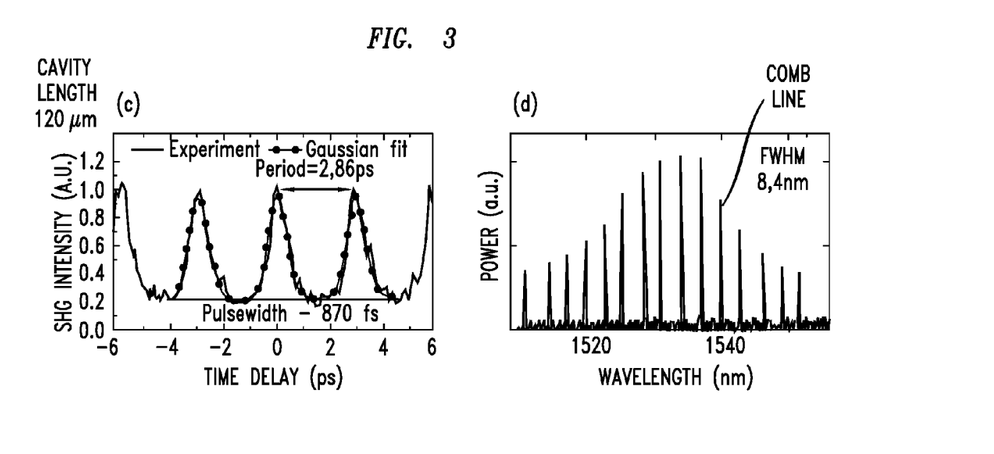
FIG. 3 contains plots for the FP laser of FIG. 1 for a cavity length of 120 µm, where

Stable combs can be generated where the mode spacing depends on the FP cavity length. FIG. 2 illustrates a typical output from a mode-locked laser (MLL) with an FP cavity length of 170 μm, where FIG. 2(a) is an autocorrelation trace (time response) showing the generated period to be on the order of 4.07 ps and FIG. 2(b) is the optical spectrum. The individual mode-locked wavelengths shown in the spectrum of FIG. 2(b) are defined as the "comb lines", where in this case a relatively large number of individual comb lines are generated. The plots shown in FIG. 3 are associated with a typical comb generator having an FP cavity length of 120 μm. Here, the autocorrelation plot of FIG. 3(a) shows a periodicity on the order of 2.86 ps, and the spectrum shown in FIG. 3(b) yields a smaller number of comb lines than the longer cavity associated with plot of FIG. 2(b).

Inasmuch as the number of comb lines produced by a conventional mode-locked laser (MLL) is a function of the properties of III-V material used to form the gain portion of the cavity structure, to the knowledge of the inventors there is no suitable mechanism for controlling the number of generated lines. As a result, system inefficiencies may arise from not being able to select/control a specific number of comb lines for a particular application. For example, the composition of the III-V lasing structure, as well as the length of the cavity itself, may result in generating far too many lines than are required (impacting the power budget, efficiency, and the like). Alternatively, a given MLL configuration may not generate enough lines for a specific application (for example, a dense WDM-based optical communication system), thus requiring additional MLLs to be used. As will be discussed in detail below, incorporating a silicon-based filter within the cavity of the MLL gives the system designer the ability to control the number of comb lines generated by the device.

Figure 4:
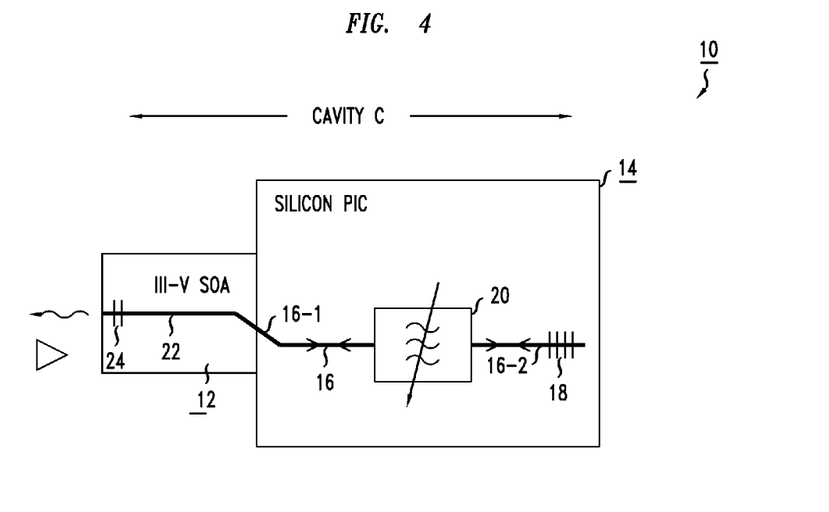
FIG. 4 is an example diagram illustrating various concepts associated with a hybrid III-V/silicon mode-locked laser with a controllable number of comb lines formed in accordance with one or more embodiments of the present invention.

FIG. 4 is a diagram of a hybrid III-V/silicon mode-locked laser (MLL) 10 that is capable of generating a selected number of comb lines (i.e., mode-locked lasing wavelengths) in accordance with the teachings of the present disclosure. MLL 10 is shown as comprising a III-V based semiconductor optical amplifier (SOA) 12, which is optically coupled to a silicon photonic integrated circuit (PIC) 14. SOA 12 may comprise any appropriate III-V based type of gain structure typically used including, but not limited to, bulk materials, quantum well structures, quantum dot structures, and the like.

In accordance with various embodiments of the present invention, silicon PIC 14 is formed to include an interface waveguide 16 that is coupled at a first end termination 16-1 to SOA 12. A first mirror 18 is disposed at an opposing, far-end termination 16-2 of waveguide 16, where as will be discussed in detail below, first mirror 18 forms one termination of the hybrid laser cavity formed by the combination of SOA 12 and PIC 14. In the particular configuration shown in FIG. 4, first mirror 18 is formed to be fully reflective (e.g., 100% reflectivity).

It is to be understood that the use of the phrase "fully reflective" within this disclosure is to mean an element having the requisite reflectivity value required to create an end termination of a laser cavity. While in the art this is often referred to as a "100% reflectivity" component, actual values less than 100% (say, for example (but not limited to), 98% or 99%), are able to function as an end termination of a laser cavity and further for the purposes of this disclosure are considered to fall within the definition of "fully reflective". Thus, for the purposes of describing various exemplary embodiments, a cavity is formed as long as one reflectivity is different from the other. Any values mentioned above or discussed in detail below are merely illustrative values and should be considered as thus without any limiting effect. Throughout the remainder of this discussion, the terms "fully" and "partially" may be used to define the two different mirrors disposed at opposing ends of the hybrid laser cavity.

Referring back to FIG. 4, an optical filter 20 is shown as disposed between end termination 16-1 of waveguide 16 and first mirror 18. As will be discussed in detail below, optical filter 20 is used to control the specific number of mode-locked wavelengths provided as an output from MLL 10. As also shown in FIG. 4, SOA 12 includes an optical waveguide 22 that couples to first end termination 16-1 of silicon PIC waveguide 16. A second mirror 24 is formed at an opposing termination of optical waveguide 22, where the combination of second mirror 24, waveguides 22 and 16, and first mirror 18 defines the cavity C of the hybrid III-V/silicon laser structure. In this exemplary configuration where first mirror 18 is formed as a fully reflective mirror, second mirror 24 is formed as a partially reflective mirror so that the output radiation from MLL 10 exits via this partially reflective surface, as shown in FIG. 4.

In accordance with one or more embodiments of the present invention, optical filter 20 is formed within PIC 14 and is disposed along waveguide 16 between partially reflective mirror 24 and fully reflective mirror 18 (i.e., forming an "intra-cavity filter"). As will be described in detail hereinbelow, the parameters of optical filter structure 20 are selected to define the specific number of comb lines (i.e., mode-locked wavelengths) that are ultimately provided as the output of hybrid MLL 10 (in this case, as emitted from mirror 24). It is to be understood that in an alternative configuration of the exemplary embodiment shown in FIG. 4, first mirror 18 may be formed as a partially reflective mirror and second mirror 24 may be formed as a fully reflective mirror. With this alternative positioning of the mirrors, the output "controlled" comb lines from hybrid MLL 10 would exit from first mirror 18.

Figure 5:
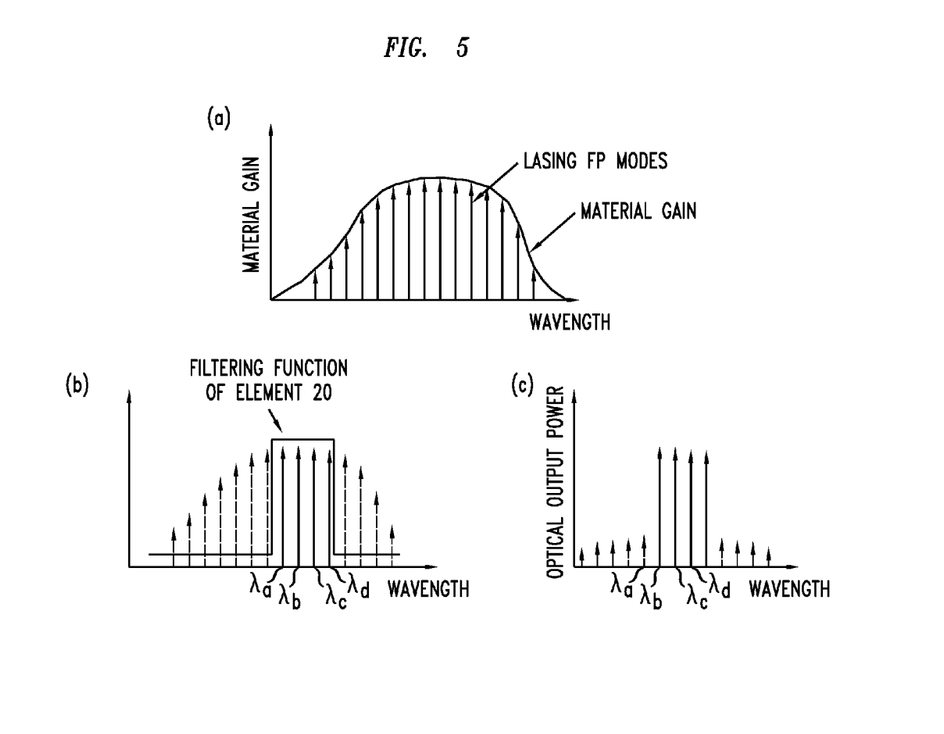
FIG. 5 is a set of plots illustrating a methodology employed by embodiments of the present disclosure, where

FIG. 5 illustrates the principles of operation associated with one or more embodiments of the present invention. FIG. 5(a) illustrates the conventional mode-locked response associated with the hybrid laser structure of SOA 12 and PIC 14 when no filtering takes place along waveguide 16. The specific mode-locked wavelengths are shown as arrows, with the envelope illustrating the relative gain available at each wavelength as a function of the particular III-V material used in the formation of SOA 12.

For the sake of discussion, it is presumed that a set of four mode-locked wavelengths (comb lines) is required for a specific application. In accordance with the teachings of the present invention, therefore, optical filter 20 is configured to allow for only four comb lines to be supported within the hybrid mode-locked laser cavity and ultimately exit from partially reflective mirror 24 of SOA 12. Referring to FIG. 5(b), an exemplary filtering function for optical filter 20 is shown, where this filtering function allows only wavelengths $\lambda_a$, $\lambda_b$, $\lambda_c$, and $\lambda_d$ to pass, rejecting all other wavelengths (the rejected wavelengths may be coupled into some type of absorber or other device that isolates waveguide 16 from further interaction with signals at these wavelengths). The resulting output from MLL 10 is the four selected wavelengths, as shown in FIG. 5(c). It is an aspect of the present invention that the parameters of optical filter 20 may be selected such that those comb lines associated with the greatest optical power are selected. While it is possible to control optical fiber 20 so select any specific mode-locked wavelengths (using a set of notch filters, for example), in most applications it would be preferred to select the highest power comb lines. Indeed, the filtering function shown in FIG. 5(b) is "positioned" (in terms of its defined passband wavelength range) to select the set of four comb lines exhibiting the highest power. It is to be understood that the selection of four wavelengths is exemplary only; the filtering function provided by optical filter 20 can be readily configured to allow for any desired number of wavelengths to be provided as the output from the hybrid laser structure.

There are various silicon-based wavelength filtering schemes that may be used in accordance with the present invention to control the specific number of mode-locked wavelengths that are produced by the inventive hybrid laser structure. Passband filters, low-pass filters, high-pass filters, notch filters, and combinations of these filters are all well-understood and useful in configuring optical filter 20 in an efficient manner. Optical filter 20 may be formed as a passive device, where the number of mode-locked wavelengths (comb lines) remains fixed, or as an active device where the filter characteristics may be tuned to adjust the number of comb lines that are generated. Optical filter 20 may be "tunable" at the time of deployment, or may be a dynamic configuration with the continuing ability to change the number of generated comb lines as a function of time. As will be discussed in detail below, specific filter configurations such as ring resonators, coupled ring structures, gratings (including arrayed waveguide gratings), are some of the specific elements that may be used in the formation of optical filter 20.

Figure 6:
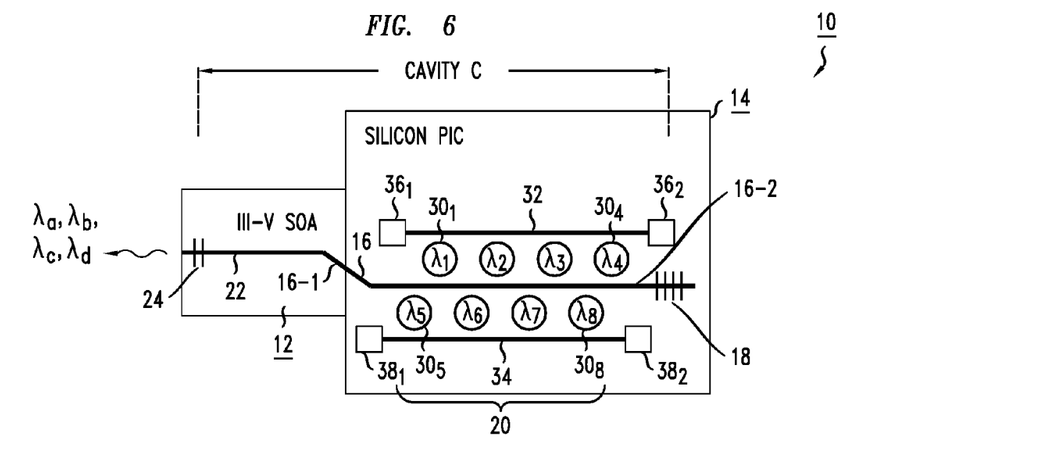
FIG. 6 illustrates an exemplary embodiment of the present invention, where the optical filter comprises a set of ring resonators used to remove selected mode-locked wavelengths from the laser output.

FIG. 6 illustrates an exemplary embodiment of the present invention, where in this case optical filter 20 comprises a set of eight ring resonators $30_1$, $30_2$, . . . , $30_8$, with four rings disposed on either side of waveguide 16. In this particular embodiment, each ring $30_i$ is configured to resonate at a different wavelength $\lambda_i$, thus coupling light at its resonant wavelength out of optical waveguide 16 and into an associated tap waveguide. In the configuration shown in FIG. 6, ring resonators $30_1$, $30_2$, $30_3$ and $30_4$ are disposed to evanescently couple their respective resonant wavelengths into a first tap waveguide 32. Ring resonators $30_5$, $30_6$, $30_7$, and $30_8$ are disposed to evanescently couple light at their resonant wavelengths into a second tap waveguide 34. Optical absorbers $36_1$ and $36_2$ are coupled to opposing end terminations of first tap waveguide 32 and function to isolate the filtered wavelengths and prevent any light at these wavelengths from being re-introduced into waveguide 16. A pair of optical absorbers $38_1$ and $38_2$ is similarly disposed at opposing end terminations of second tap waveguide 34 to perform the same isolation function.

In accordance with this embodiment of the present invention, when a given ring filter 30 is tuned to the same wavelength as a mode-locked wavelength of the laser, that comb line is filtered out ("dropped") from the cavity and is directed into one of the absorbers 36, 38. That comb line no longer lases and is effectively turned "off".

Figure 7:
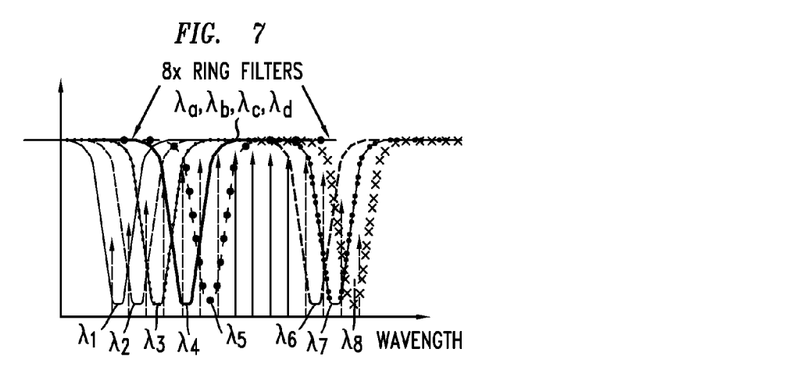
FIG. 7 is a graph of the optical spectrum associated with the embodiment of FIG. 6.

FIG. 7 is a graph depicting the filtering properties of the group of ring resonators 30, showing the how each of the specific wavelengths outside of the selected set ($\lambda_a$, $\lambda_b$, $\lambda_c$, and $\lambda_d$) is removed. In accordance with the teachings of the present disclosure, therefore, by knowing the number of comb lines that is desired to be generated, optical filter 20 is designed to eliminate all of the unwanted comb lines so that MLL 10 only generates the specified number of mode-locked wavelengths.

Figure 8:
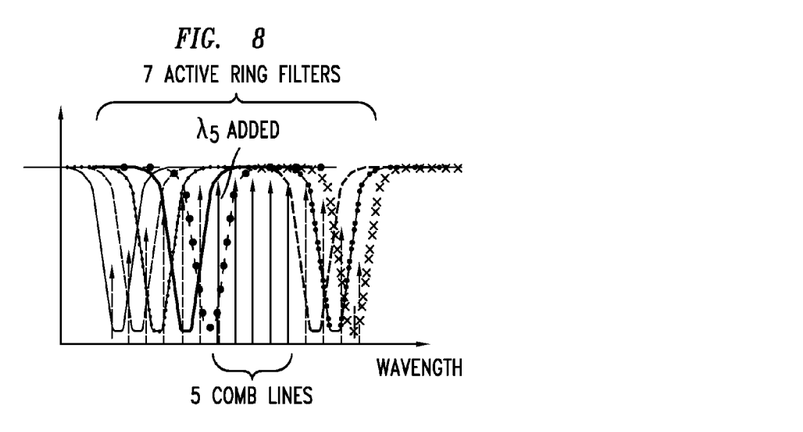
FIG. 8 is a graph of the optical spectrum associated with an alternative implantation of the embodiment of FIG. 6; namely, where a ring resonator is turned "off" and an additional mode-locked wavelength forms part of the laser output.

In further accordance with this particular embodiment of the present invention, it is possible to control the number of ring filters that are active and, therefore, use this feature to control the number of comb lines generated by the laser structure. For example, presuming that ring resonator $30_5$ as shown in FIG. 6 is turned "off", the mode-locked laser emission at wavelength Xs will not be filtered out, but will continue to propagate within the laser cavity. FIG. 8 is a plot illustrating the result of this variation, with turning "off" ring resonator $30_5$. In this case, MLL 10 provides a set of five comb lines as the output from SOA 12. Advantageously, the ability to selectively turn "on" and "off" individual rings allows for the number of generated comb lines to be modified, as needed. Various devices and methods are well-known in the art for controlling the on/off action of elements such as ring resonators. It is to be understood that each ring resonator is tuned to a different wavelength so as to avoid any potential Vernier effect and/or parasitic oscillation within the hybrid cavity.

Figure 9:
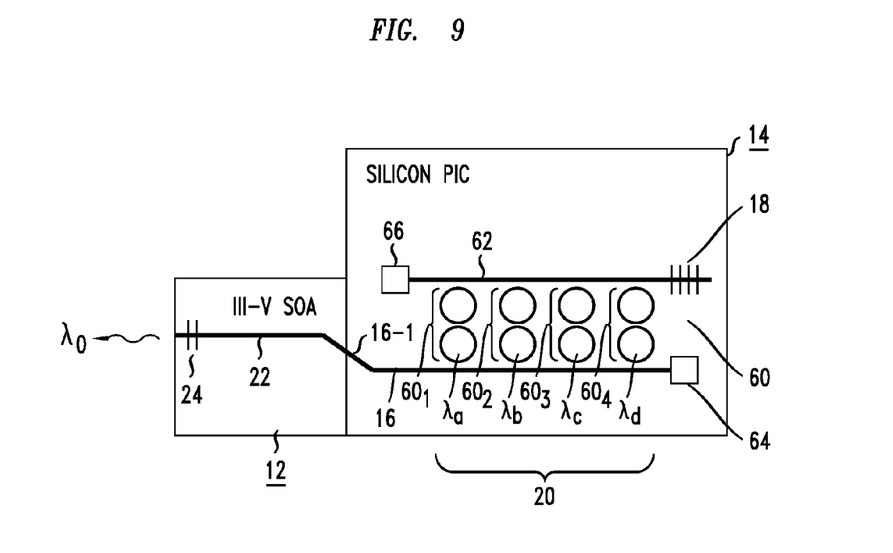
FIG. 9 illustrates another embodiment of the present invention, in this case where the optical filter comprises a "coupled ring optical waveguide" (CROW) configuration.

FIG. 9 depicts an alternative embodiment of the present invention, in this case utilizing a "coupled ring optical waveguide" (CROW) structure in the implementation of optical filter 20. The elements of the FIG. 9 embodiment which perform the same function as the embodiment of FIG. 6 contain the same reference numerals and are not described again in detail. As discussed in the following, a CROW structure is particularly well-suited for the situation where only a relatively few comb lines are required to be generated by the hybrid laser structure. That is, the CROW geometry is useful in filtering out a large number of wavelengths in a controlled manner. Other types of large bandwidth filters may obviously be used for this type of "few comb line" application, where it is desired to create a "flat top" filter.

Referring to FIG. 9, optical filter 20 is shown as comprising a set of eight ring resonators 60 disposed in a "coupled" configuration between input waveguide 16 and a return waveguide 62, in this case organized as four separate pairs of coupled rings, denoted as $60_1$, $60_2$, $60_3$, and $60_4$ in FIG. 9. It is to be understood that a given CROW structure may use any desired number of cascaded rings in a signal path between a pair of waveguides. The specific illustration in FIG. 9 where each path includes only a pair of rings is exemplary only.

Figure 10:
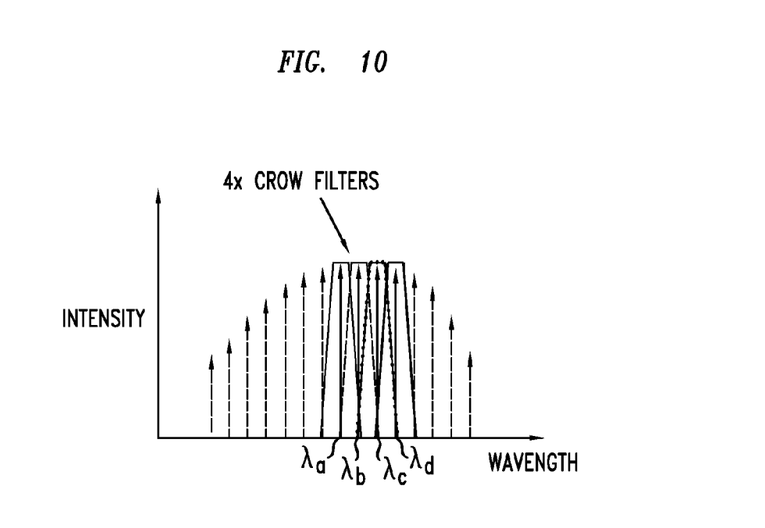
FIG. 10 is a graph of the mode-locked wavelength output from the structure of FIG. 9, in this case where the resonant wavelengths for different coupled pairs of resonators are detuned to increase the number of comb lines provided as an output from the inventive structure.

In accordance with the resonant properties of the ring structures, the configuration as shown in FIG. 9 can be implemented such that each CROW filter element $60_1$, $60_2$, $60_3$, and $60_4$ removes all wavelengths except for its defined mode-locked wavelength. For example, CROW filter element $60_1$ may be configured to have a resonant wavelength $\lambda_a$, filter element $60_2$ may be configured to have a resonant wavelength $\lambda_b$, filter element $60_3$ may be configured to have a resonant wavelength $\lambda_c$, and filter element $60_4$ may be configured to have a resonant wavelength $\lambda_d$. The remaining wavelengths created by this mode-locked laser structure are absorbed by either a first absorbing element 64 disposed at the end termination of input waveguide 16, or a second absorbing element 66 disposed at an end termination of the return waveguide 62 (that is, disposed in opposition to first reflecting mirror 18, as shown). With this filter configuration, the hybrid laser arrangement of FIG. 9 will provide a set of four mode-locked wavelengths as the output, as shown by the plot of FIG. 10.

Figure 11:
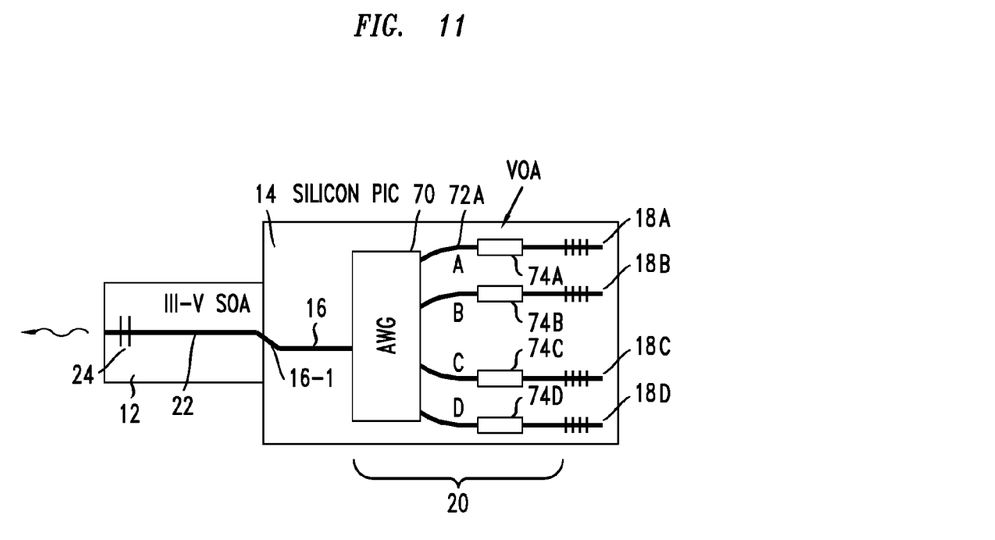
FIG. 11 illustrates yet another embodiment of the present invention, where an arrayed waveguide grating (AWG) structure is used in combination with a set of separate cavity waveguides to provide for selective control of the number of comb lines provided as an output from the hybrid laser structure.
Figure 12:
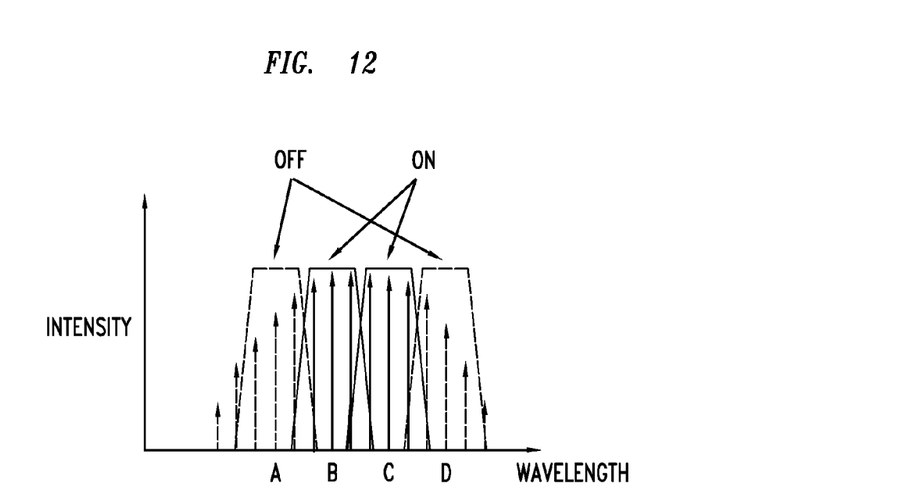
FIG. 12 is a plot of the optical spectrum associated with the configuration of FIG. 11.

Another way to realize a mode-locked laser with a tunable number of comb lines is to use an arrayed waveguide grating (AWG) as optical filter 20. FIG. 11 illustrates an exemplary configuration of an AWG-based embodiment of the present invention. In this case, an arrayed waveguide structure 70 is fabricated within silicon PIC 14 and for this particular embodiment is configured to separate the generated optical spectrum into four separate output wavelength ranges, shown as wavelength ranges A, B, C, and D. The optical spectrum illustrated in FIG. 12 displays the various wavelength ranges. Referring again to FIG. 11, the set of mode-locked wavelengths falling within wavelength range A is shown as coupled into a first output waveguide $72_A$ from AWG 70, with the mode-locked wavelengths falling within wavelength range B coupled into a second output waveguide $72_B$. Similarly, the mode-locked wavelengths falling within wavelength range C are coupled into a third output waveguide $72_C$ and the mode-locked wavelengths falling within wavelength range D are coupled into a fourth output waveguide $72_D$.

Also shown in FIG. 11 is a set of four separate variable optical attenuators (VOA) $74_A$, $74_B$, $74_C$, and $74_D$, associated with waveguides 72 in a one-to-one relationship. Each waveguide $72_i$ is shown as terminating in a separate fully reflective mirror $18_i$. Therefore, depending on which VOAs are turned "on", specific reflective mirror(s) 18 are used to define the termination of the laser cavity.

In accordance with this embodiment of the present invention, if a given VOA $74_i$ has zero applied bias (i.e., there is no attenuation), then its associated reflective mirror $18_i$ receives an optical signal propagating along waveguide $72i$ and forms the active cavity for the MLL structure. Thus, any mode-locked wavelengths present within the associated wavelength range will continue to lase and be presented as the output wavelengths from the MLL structure. If a selected VOA $74_i$ is forward biased, then there is attenuation along its associated waveguide $72_i$ and the cavity is effectively turned "off" and any mode-locked wavelength that passes along that waveguide is attenuated such that little (if any power) is reflected by mirror 18, and, as a result will no longer lase.

Accordingly, it is possible in this configuration to further control the number of generated comb lines by controlling the number of VOAs that are biased into the attenuation state. Referring to the optical spectrum of FIG. 12, VOAs $74_A$ and $74_D$ are biased to turn "off" mirrors $18_A$ and $18_B$, in this case creating a pair of active laser cavities (associated with wavelength ranges B and C), that in this example provide a set of six mode-locked wavelengths as the MLL output.

Summarizing, the teachings of the present disclosure as outlined above allow for the low-cost integration of a reconfigurable multi-wavelength laser. The various novel architectures require a single SOA device and a single photonic integrated circuit, yet are able to select (and control) the specific number of comb lines generated by the laser. The number of generated comb lines can be actively controlled depending on the power, noise and spectral needs of a given optical link. Such devices are contemplated as being able to fulfill the requirements of fast reconfigurable and WDM network at an optimized cost.

Being able to tune the number of lasing wavelengths allows for greater power efficiency from the laser, and high output power at the selected wavelengths (instead of losing power from the unused comb lines). Being able to actively tune the number of comb lines allows for fast reconfiguration of an optical network based on changing noise and bandwidth requirements.

While this invention has been described with references to illustrative embodiments, this description is not intended to be construed in a limiting sense. Although embodiments of the invention have been described as implementing optical filters including rings, CROWs, and AWGs, it is to be understood that any other suitable type of optical filter can be used. Various modifications of the described embodiments, as well as other embodiments of the invention, which are apparent to persons skilled in the art to which the invention pertains are deemed to lie within the principle and scope of the invention as expressed in the following claims.

What is claimed is:

1. An apparatus comprising
a gain element formed of III-V material;
a first mirror optically coupled to the gain element; and
a silicon photonic integrated circuit (PIC) coupled to the gain element, the silicon photonic integrated circuit including
an optical waveguide coupled at a first end to the gain element;
a second mirror coupled to a second end, opposing the first end of the optical waveguide, wherein the first mirror has a first reflectivity and the second mirror has a second reflectivity which is different from the first reflectivity, the first mirror and the second mirror defining a hybrid laser cavity configured to generate a number of mode-locked output wavelengths; and a plurality of silicon-based optical filters, optically connected in parallel relative to each other and disposed along the hybrid laser cavity and configured to select the number of mode-locked wavelengths generated as an output of the apparatus.

2. The apparatus as defined in claim 1 wherein one or more silicon-based optical filters from the plurality of silicon-based optical filters is configured as a passband filter, such that only those mode-locked wavelengths within the passband are provided as the output of the apparatus.

3. The apparatus as defined in claim 1 wherein one or more silicon-based optical filters from the plurality of silicon-based optical filters is a passive optical filter.

4. The apparatus as defined in claim 1 wherein one or more silicon-based optical filters from the plurality of silicon-based optical filters is an active optical filter having a passband tunable in range and center wavelength configured to selectively change the number of mode-locked wavelengths emitted by the apparatus as the filter passband is adjusted by tuning.

5. The apparatus as defined in claim 1 wherein one or more silicon-based optical filters from the plurality of silicon-based optical filters comprises a plurality of ring resonators disposed at least on one side of the optical waveguide for removing emissions at non-selected mode-locked wavelengths from the hybrid laser cavity, each ring resonator exhibiting a different resonant wavelength.

6. The apparatus as defined in claim 5 wherein one or more silicon-based optical filters from the plurality of silicon-based optical filters comprises at least one tap waveguide coupled to the plurality of ring resonators for receiving the non-selected mode-locked wavelength emissions.

7. The apparatus as defined in claim 6 wherein one or more silicon-based optical filters from the plurality of silicon-based optical filters further comprises at least one optical absorber disposed at a termination of at least one tap waveguide, the at least one optical absorber for receiving emissions at the non-selected mode-locked wavelengths.

8. The apparatus as defined in claim 5 wherein one or more ring resonators is capable of being turned "on" or "off" to selectively control the number of mode-locked output wavelengths.

9. The apparatus as defined in claim 5 wherein the ring resonators are configured as a plurality of coupled ring optical waveguide (CROW) arrangements, each arrangement formed of a linear disposition of at least two separate ring resonators.

10. The apparatus as defined in claim 1 wherein one or more silicon-based optical filters from the plurality of silicon-based optical filters comprises
an arrayed waveguide grating (AWG) for separating a plurality of mode-locked laser wavelengths along a set of N separate signal paths;
a set of N waveguides coupled to the AWG, each waveguide for supporting mode-locked wavelengths within an associated wavelength range;
a set of N control elements, each control element disposed along a separate one of the set of N waveguides; and
a set of N mirrors, each mirror disposed at a termination of a separate one of the set of N waveguides, wherein the set of N control elements selectively passes optical signals between the AWG and the set of N mirrors, to control the number of mode-locked wavelengths generated as an output of the apparatus.

11. The apparatus as defined in claim 10 wherein the set of N control elements comprises a set of N variable optical attenuators.

12. A method comprising
providing III-V gain material having a termination including a mirror facet;
providing a silicon-based photonic integrated circuit (PIC) including an optical waveguide terminating at a mirror element, and a plurality of optical filters optically connected in parallel relative to each other and disposed along the optical waveguide, each of the optical filters of the plurality of optical filters having a tunable passband;
coupling the gain material to the photonic circuit so as to create a hybrid laser cavity between the mirror facet of the gain material and the mirror element of the silicon-based PIC;
defining a specific number of mode-locked wavelengths; and
tuning one or more optical filter from the plurality of the optical filters to pass the defined, specific number of mode-locked wavelengths.

13. The method as defined in claim 12 wherein the defining and tuning steps are repeated over time as needed to continually control the number of generated mode-locked output wavelengths.

14. A hybrid mode-locked laser structure having a controllable number of mode-locked output wavelengths comprising
a gain element formed of III-V material and including a first mirror; and
a silicon photonic integrated circuit (PIC) coupled to the gain element, the silicon photonic integrated circuit including
an optical waveguide coupled at a first end to the gain element;
a second mirror coupled to a second end, opposing the first end of the optical waveguide, wherein the first mirror has a first reflectivity and the second mirror has a second reflectivity which is different from the first reflectivity, and the first mirror and the second mirror defining a hybrid laser cavity; and
a plurality of silicon-based optical filters, optically connected in parallel relative to each other and disposed along the hybrid laser cavity and configured to control the number of mode-locked wavelengths generated as an output of the hybrid mode-locked laser structure.

* * * * *